US008602597B2

(12) United States Patent
Lopez et al.

(10) Patent No.: US 8,602,597 B2
(45) Date of Patent: Dec. 10, 2013

(54) HEAT SINK RETAINING STRUCTURE FOR LIGHT EMITTING DEVICE BOARD ASSEMBLIES, AND METHODS

(75) Inventors: Peter E. Lopez, Cary, NC (US); Michael Lay, Cary, NC (US)

(73) Assignee: Cree, Inc., Durham, NC (US)

( * ) Notice: Subject to any disclaimer, the term of this patent is extended or adjusted under 35 U.S.C. 154(b) by 134 days.

(21) Appl. No.: 12/947,267

(22) Filed: Nov. 16, 2010

(65) Prior Publication Data

US 2012/0120659 A1   May 17, 2012

(51) Int. Cl.
*F16B 7/20*    (2006.01)
*F21V 29/00*   (2006.01)

(52) U.S. Cl.
USPC ...... 362/294; 362/651; 362/373; 362/249.02; 165/67; 403/348; 403/349; 403/353

(58) Field of Classification Search
USPC ............ 362/547, 218, 651, 294, 373, 249.02; 165/67, 80.3, 185; 403/348, 349, 353
See application file for complete search history.

(56) References Cited

U.S. PATENT DOCUMENTS

| 2,110,130 | A | * | 3/1938 | Michel et al. | 439/332 |
| 2,110,136 | A | * | 3/1938 | Douglas | 403/24 |
| 2,933,711 | A | * | 4/1960 | Eaton | 439/316 |
| 4,756,638 | A | * | 7/1988 | Neyret | 403/261 |
| 5,208,731 | A | * | 5/1993 | Blomquist | 361/704 |
| 5,323,845 | A | * | 6/1994 | Kin-shon | 165/80.3 |
| 6,787,999 | B2 | * | 9/2004 | Stimac et al. | 315/51 |
| 7,753,106 | B2 | * | 7/2010 | Lin et al. | 165/80.3 |
| 7,824,077 | B2 | * | 11/2010 | Chen et al. | 362/345 |
| 7,871,184 | B2 | * | 1/2011 | Peng | 362/294 |
| 7,918,587 | B2 | * | 4/2011 | Hsu et al. | 362/294 |
| 2006/0067077 | A1 | | 3/2006 | Kumthampinij et al. | |
| 2007/0285926 | A1 | * | 12/2007 | Maxik | 362/294 |
| 2008/0175003 | A1 | * | 7/2008 | Tsou et al. | 362/294 |
| 2010/0026158 | A1 | | 2/2010 | Wu | |
| 2010/0103675 | A1 | | 4/2010 | Yu et al. | |
| 2010/0232164 | A1 | | 9/2010 | Tessnow et al. | |
| 2011/0309751 | A1 | * | 12/2011 | Ter-Hovhannisyan | 315/113 |
| 2012/0176796 | A1 | * | 7/2012 | Bertram et al. | 362/249.02 |

FOREIGN PATENT DOCUMENTS

WO   WO 2012/067723   5/2012

OTHER PUBLICATIONS

International Search Report and Written Opinion for Application Serial No. PCT/US2011/054553 dated May 14, 2012.

* cited by examiner

*Primary Examiner* — Ismael Negron
(74) *Attorney, Agent, or Firm* — Jenkins, Wilson, Taylor & Hunt, P.A.

(57) ABSTRACT

An assembly includes a board, a heat sink, one or more retainers, and/or one or more light-emitting diode packages. The board includes a face surface, a rear surface opposite the face surface, and side edges. The one or more retainers are configured to secure the board to the heat sink. One or more light-emitting diode packages can be secured to the board for creating a light-emitting device assembly.

45 Claims, 8 Drawing Sheets

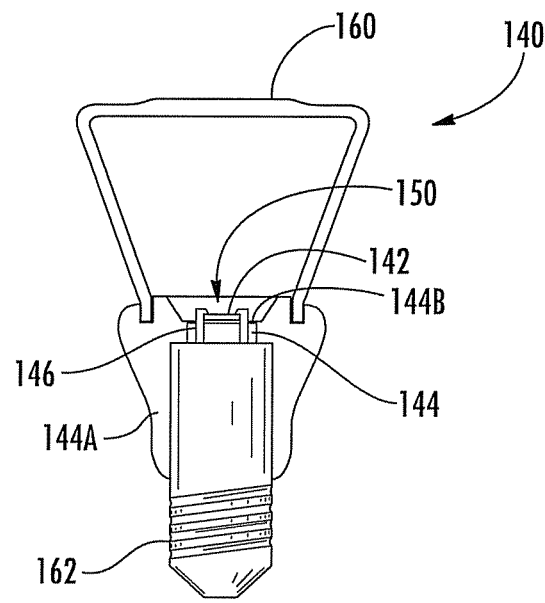
FIG. 8
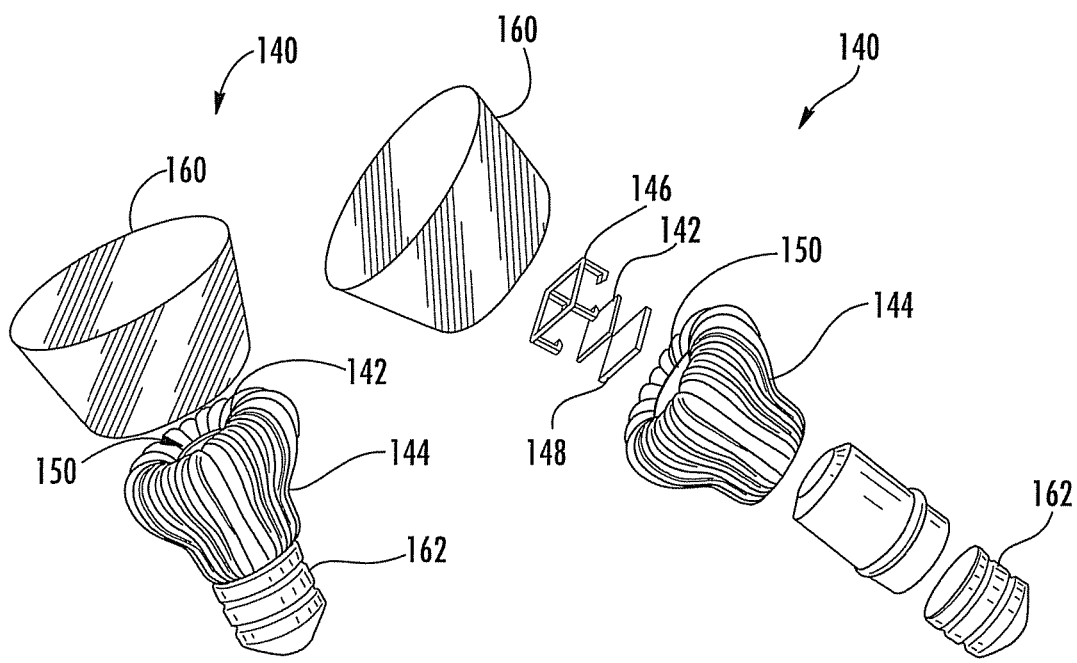
FIG. 9
FIG. 10

HEAT SINK RETAINING STRUCTURE FOR LIGHT EMITTING DEVICE BOARD ASSEMBLIES, AND METHODS

TECHNICAL FIELD

The present subject matter generally relates to board assemblies for attaching a board to a heat sink. More particularly, the present subject matter relates to assemblies that include apparatuses for attaching, for example, a printed circuit board to a heat sink that can be used in different applications including light emitting device assemblies.

BACKGROUND

Printed circuit boards are often used in many applications to operate or run electronic devices. Due the circuitry on such printed circuit boards and the amount of energy used to operate them, these printed circuit boards can often generate a large amount of heat. To improve the operability, the printed circuit boards are often attached to a device or substrate that can facilitate dissipation of the heat away from the printed circuit boards. By removing the heat, the printed circuit boards can operate at lower temperatures. By operating at lower temperatures, the components of the printed circuit boards can more readily function in their intended manner. In some cases, the lower operating temperatures can allow for the use of smaller components on the printed circuit boards to permit the printed circuit boards to be offered in smaller sizes.

The devices or substrates that are attached to the printed circuit boards, hereinafter referred to as heat sinks or heat sink structures, often directly or indirectly contact the printed circuit boards and draw heat away from the printed circuit boards. The heat sinks can be made of materials that are thermally conductive to more readily pull or conduct heat away from the printed circuit boards. Additionally, the size and shape of the heat sinks can improve heat dissipation from the printed circuit boards.

The use of heat sinks in conjunction with electrical boards, such as printed circuit boards, can be especially advantageous when the printed circuit board is being used in a lighting fixture, such as a light-emitting diode fixture, that tends to generate even more heat than just a printed circuit board alone. Various implementations of light-emitting diode lighting fixtures are becoming available in the marketplace to fill a wide range of applications. Such different lighting applications in which light-emitting diodes can be used include domestic lighting, billboard and display lighting, automotive and bicycle lighting, emergency lighting, traffic and railway lighting, and floodlight and flashlight use. Light-emitting diodes are smaller than incandescent bulbs and use less energy. In addition, light-emitting diodes have a longer life than standard incandescent light bulbs. Accordingly, the use of light-emitting diodes in lighting applications can provide significant energy savings, increased lamp life, smaller lamp size, and flexibility in the design. For these reasons, lighting manufacturers are increasingly interested in unique lighting fixtures incorporating light-emitting diodes that may also have appeal to their intended customers. For the light-emitting diode fixtures to operate properly and to provide improved lighting, heat needs to be dissipated from the light-emitting diode.

As stated above, good direct or indirect contact between the heat sink and printed circuit boards is desired to increase the effectiveness of heat dissipation from the printed circuit boards, especially those that include light-emitting diodes. Typically, printed circuit boards are attached to the heat sinks by screws or the like. The screws have a tendency to unscrew or back out, which, in turn, permits the amount of contact between the printed circuit board and the heat sink to decrease. This results in a lessening of the thermal transfer to the heat sink. Additionally, depending on the force used to drive the screws into the heat sink, bowing of the printed circuit board can also decrease the contact between the printed circuit board and the heat sink. For example, if one or more of the screws are fastened to tightly, the clamping force at the pressure point where the screw contacts the printed circuit board can cause the printed circuit board to bend upwardly.

Further, when using screws to hold printed circuit boards to heat sinks, the ability to remove and reattach the printed circuit board to the heat sink while still optimizing thermal transfer after reattachment is often lessened. Once a screw is driven into the heat sink, the frictional hold between the screw and the heat sink is often lessened if the screw is removed and reinserted into the same hold. This can lead to a tendency of the screws to loosen or back out.

While using heat sinks in conjunction with printed circuit boards can improve heat dissipation, providing good contact between the printed circuit boards and the heat sinks can be important. Good clamp forces between the heat sinks and the printed circuit boards can improve the contact between them. Additionally, the ability to quickly attach the printed circuit board to the heat sink in a repeatable fashion is desirable to improving related manufacturing. Further, the ability to remove and reattach the printed circuit boards while still providing good clamping force and contact between the printed circuit board and the heat sink is desired.

SUMMARY

In accordance with this disclosure, board assemblies for attaching a board to a heat sink, light-emitting device assemblies and methods of making the same are provided. For example, one or more retainers for attaching a board to a heat sink that can be used in light emitting assemblies are provided. It is, therefore, an object of the present disclosure to provide board assemblies and/or light-emitting device assemblies for attaching a board to a heat sink that can provide good clamping force and contact between the boards and heat sinks.

This and other objects of the present disclosure as can become apparent from the present disclosure are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIG. 8 illustrates a perspective view of further embodiment of a light emitting device assembly according to the present subject matter;

FIG. 9 illustrates a cross-sectional view along the length of the embodiment of the light emitting device assembly according to FIG. 8; and FIG. 10 illustrates an exploded view along the length of the embodiment of the light emitting device assembly according to FIG. 8.

DETAILED DESCRIPTION

Reference will now be made in detail to possible embodiments of the present subject matter, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present invention. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion.

Furthermore, relative terms such as "on" or "above" are used herein to describe one structure's or portion's relationship to another structure or portion as illustrated in the figures. It will be understood that relative terms such as "on" or "above" are intended to encompass different orientations of the device in addition to the orientation depicted in the figures. For example, if the device in the figures is turned over, structure or portion described as "above" other structures or portions would now be oriented "below" the other structures or portions. Likewise, if the device in the figures is rotated along an axis, stricture or portion described as "above", other structures or portions would now be oriented "next to" or "left of" the other structures or portions. Like numbers refer to like elements throughout.

Figure 1:
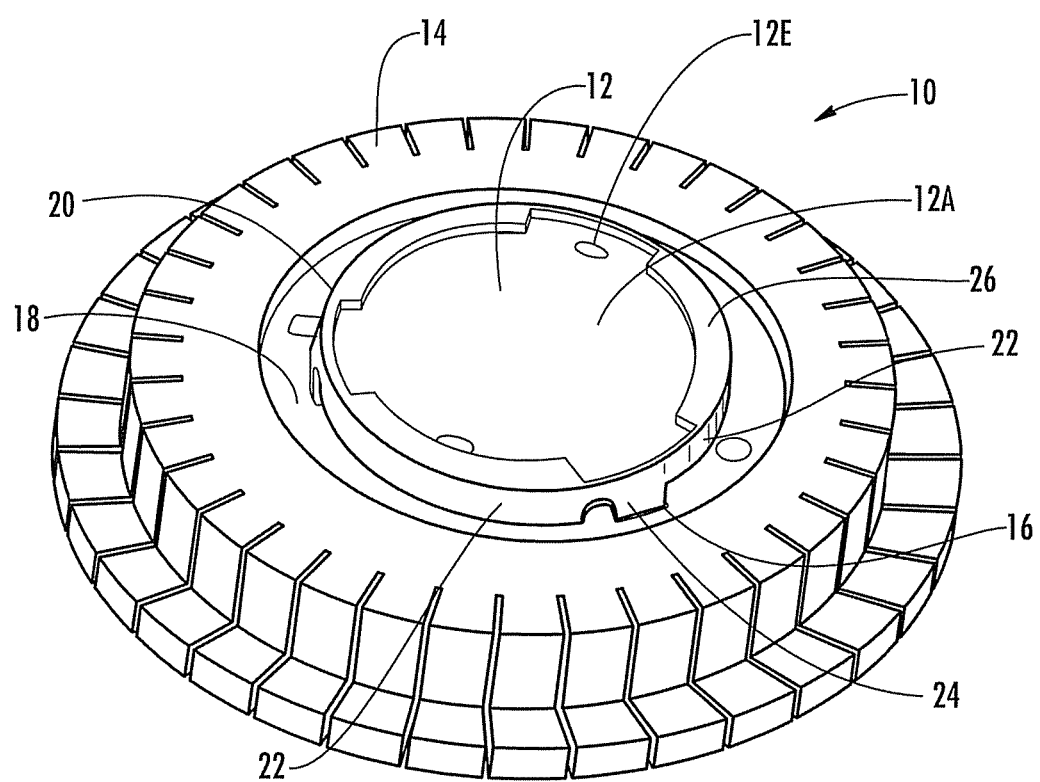
FIG. 1 illustrates a perspective top view of an embodiment of a printed circuit board assembly according to the present subject matter.
Figure 2:
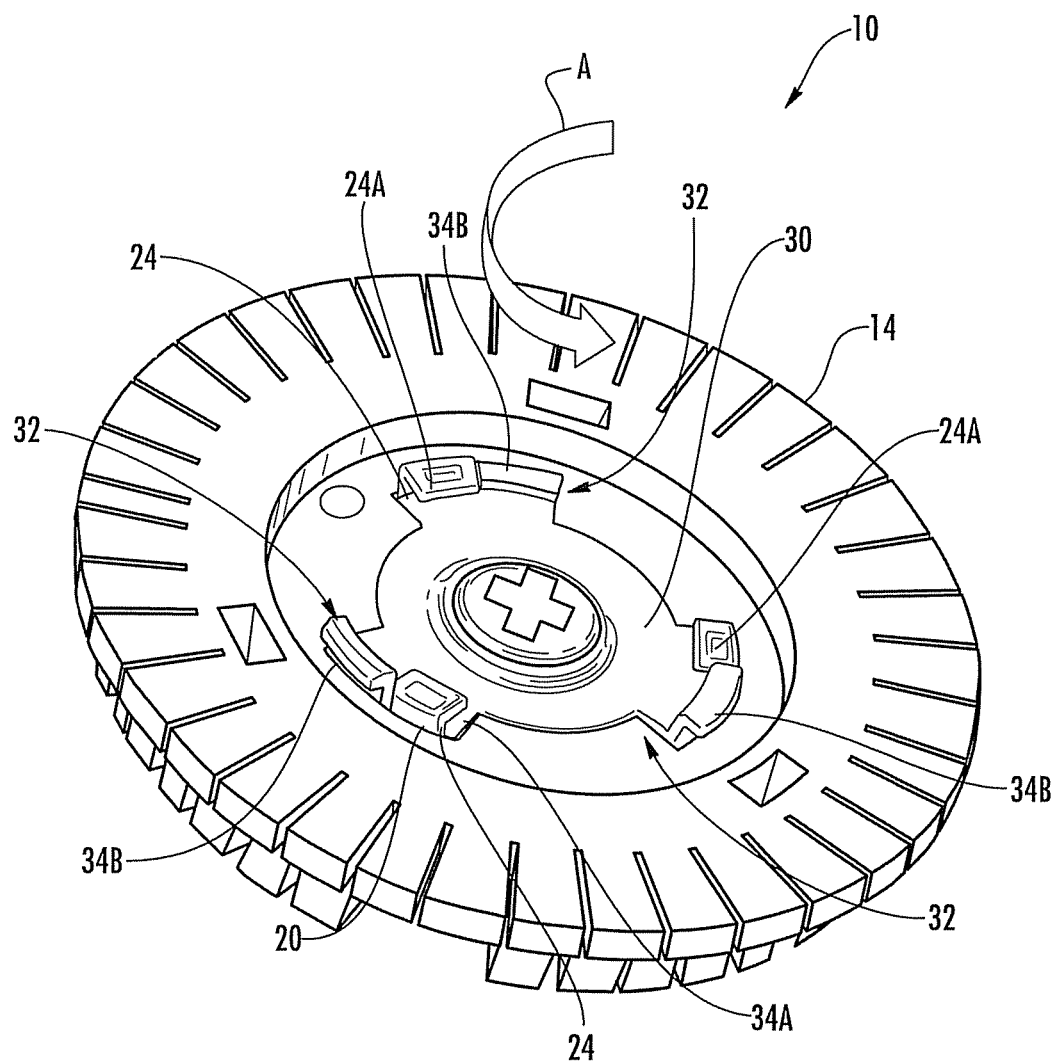
FIG. 2 illustrates a perspective bottom view of the embodiment of a printed circuit board assembly according to FIG. 1.
Figure 3:
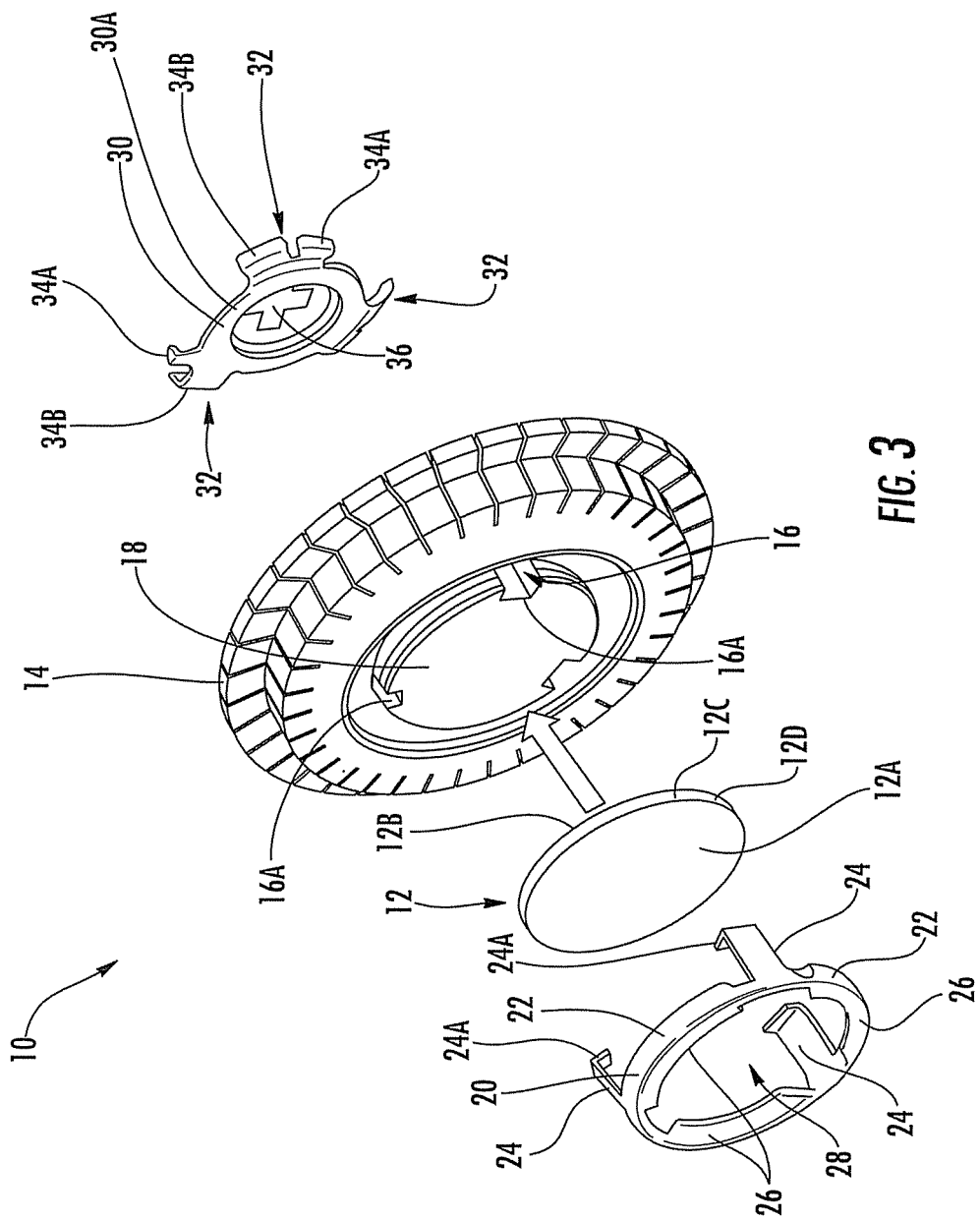
FIG. 3 illustrates an exploded view of the embodiment of a printed circuit board assembly according to FIG. 1.
Figure 4A:
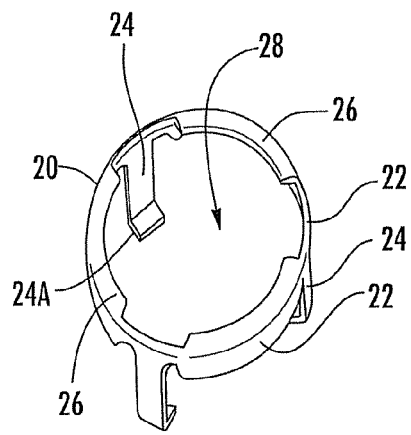
FIGS. 4A and 4B illustrate perspective views of an embodiment of a top retainer for use in a printed circuit board assembly according to the present subject matter.
Figure 4B:
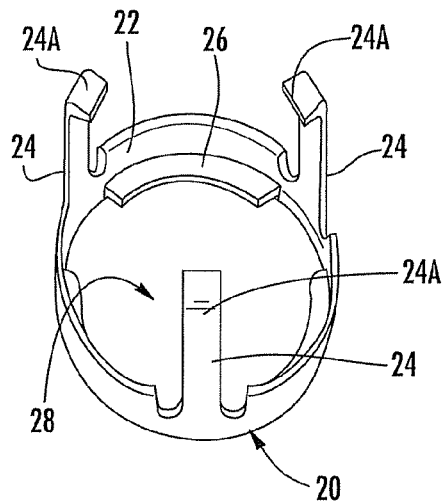

FIGS. 1-3 illustrate a board generally designated 10. Board assembly 10 can comprise a board 12 and a heat sink 14. Board assembly 10 can comprise one or more retainer apparatuses. For example and without limitation, board assembly 10 can comprise a retainer that can in one aspect be configured to secure board 12 to heat sink 14. A retainer, for instance, can be configured to be secured to heat sink 14 to secure board 12 to heat sink 14. A retainer can also be configured to receive at least a portion of board 12 with the retainer comprising at least one leg and heat sink 14 being configured to receive at least a portion of the leg of the retainer to secure board 14 to heat sink 12. In accordance with the disclosure herein, the retainer can be configured in any suitable configuration. In one aspect, the retainer can be configured to comprise portions which can function as a clip or any other suitable structure for retainment or attachment.

For example, in the embodiment shown in FIGS. 1-3, board assembly 10 comprises a top retainer 20 and a locking retainer 30. Board assembly 10 can permit board 12 to be attached to, or secured to, heat sink 14 without the use of screws or adhesives. However, in some embodiments, a thermally conductive adhesive can be used between board 12 and heat sink 14.

Board 12 can comprise, for example, a printed circuit board. Board 12 can comprise a face surface 12A and a rear surface 12B opposite the face surface 12A. Board 12 can also have side edges 12C around a periphery 12D of the board 12. Board 12 can be any shape that is desired or required. For example, board 12 can have a square cross-sectional shape, a rectangular cross-sectional shape, a circular cross-sectional shape, an oval cross-sectional shape or the like. In the embodiment shown, board 12 has a circular cross-sectional shape. Board 12 can be any suitable width, length, thickness or diameter, and it can have varying thickness across its length or width depending on the end use of board 12. As shown in FIG. 1, printed circuit board 12 can have a mark 12E to identify how it should be aligned on heat sink 14 and/or with the electronic device in which it will be used.

FIGS. 1, 3 and 4A-4B illustrate top retainer 20 and an example of its use. Top retainer 20 of printed circuit board assembly 10 can comprise a body 22 configured to fit around the periphery 12D of board 12. Body 22 can create an opening 28 in which board 12 can at least partially occupy when top retainer 20 is attached to both board 12 and heat sink 14. Opening 28 can make face surface 12A of board 12 easily accessible. Top retainer 20 can comprise one or more legs 24 that can extend downward from body 22. In the embodiment shown in FIGS. 1-3, top retainer 20 comprises three legs 24 spaced equidistance apart around the periphery of body 22. The length of legs 24 can vary depending on the thickness of printed circuit board 12 and the thickness of heat sink 14. Each leg 24 can, in some embodiments, comprise a foot 24A. Depending on how each foot 24A is used, each one can extend inwardly toward the center of top retainer 20 or outwardly away from the center of top retainer 20.

Top retainer 20 can further comprise one or more lips 26 that extend inward from body 22 in opening 28 for board 12. Lips 26 can extend over at least a portion of side edges 12C of board 12 when top retainer 20 is properly attached to board 12 and heat sink 14 of printed circuit board assembly 10 when assembly 10 is assembled. For example, top retainer 20 can comprise a plurality of lips 26 spaced equidistance apart from each other with each lip 26 being extendable over board 12 when top retainer 20 fastens board 12 to heat sink 14.

Top retainer 20 can be made of any material that is suitable to hold printed circuit board 12 to heat sink 14. For example, top retainer 20 can be made of plastic, metal, metal alloy or the like. For instance, in some embodiments, top retainer 20 can comprise steel. Steel as the construction material for top retainer 20 permits the top retainer to be strong, flexibly rigid and have a low profile. For example, when top retainer 20 is steel, the one or more lips 26 can be thin. When used in light-emitting devices, the thinness of the lip and low profile aid in decreasing any light interference between the top retainer and the light emitting diode. Steel allows for such a low profile.

Heat sink 14 can be made of any suitable material that is thermally conductive. For example, heat sink 14 can be a metal substrate. In some embodiments, heat sink 14 may be a thermally conductive plastic. Heat sink 14 can be any shape that is desired or required. For example, heat sink 14 can have a square cross-sectional shape, a rectangular cross-sectional shape, a circular cross-sectional shape, or the like. In the embodiment shown, heat sink 14 has a circular cross-sectional shape.

Heat sink 14 can have one or more apertures 16 therein through which the one or more legs 24 of top retainer 20 can extend. In the embodiment shown in FIGS. 1-3, there are three apertures 16 that correspond to the three legs 24 of top retainer 20. Heat sink 14 can also comprise a top surface 18 against which board 12 can be held. When printed circuit board 12 is placed in the opening 28 of the top retainer 20 such that the face surface 12A of board 12 faces away from legs 24 and body 22 of top retainer 20 fits around the periphery 12D of board 12, the lips 26 abut the face 12A and side edges 12C of board 12. In such a position, the legs 24 of top retainer 20 can be inserted through apertures 16 in heat sink 14 so that board 12 can be held in contact against top surface 18 of heat sink 14. Alternatively, printed circuit board 12 can be placed in its proper position on heat sink 14 and top retainer 20 can then be inserted into heat sink 14 around board 12 to forcefully hold board 12 in contact against top surface 18 of heat sink 14.

Although top retainer 20 can be configured and used to fit against heat sink 14 or any other suitable structure, locking retainer 30 can in one aspect be used. To hold top retainer 20 in place to ensure proper contact between board 12 and heat sink 14, locking retainer 30 can be used to engage legs 24 of top retainer 20 As illustrated in FIGS. 2, 3 and 5A-5B. Locking retainer 30 can comprise one or more locking receivers 32 for receiving corresponding legs 24 of top retainer 20. Locking receivers 32 can extend from a body 30A of locking retainer 30. In particular, receivers 32 can extend radially outward from body 30A. Each of locking receivers 32 of locking retainer 30 can comprise one or more leg engagement mechanisms, such as locking heels 34A and stop flanges 34B. For example, locking heels 34A and stop flanges 34B can extend outwardly from body 30A of locking retainer 30. Locking heels 34A and stop flanges 34B can be used to secure locking retainer 30 to legs 24 of top retainer 20. For example, each leg 24 of top retainer 20 can comprise a foot 24A as described above that can be engaged by one of locking heels 34A and stop flanges 34B of locking retainer 30. As above, depending on the use of each foot 24A, each foot 24a can have different configurations. For example, each foot 24A can extend inward toward the center of top retainer 20 or radially outward away from the center of top retainer 20.

As stated above and shown in FIGS. 5A-5E, each of the locking receivers 32 can comprise locking heel 34A that can engage a corresponding leg 24 of top retainer 20 upon rotation of the locking retainer 30 in a direction C. Similarly, locking heel 34A can be disengaged from the corresponding leg 24 of top retainer 20 upon rotation of locking retainer 30 in a direction opposite of, or in a reverse direction to, the direction C. It is to be understood that the positioning and alignment of locking heels 34A and stop flanges 34B can be reversed on locking retainer 30 and thus the direction of rotation for engagement and disengagement with top retainer 20 can be reversed as well.

Locking heels 34A can be ramped so that as locking retainer 30 is rotated locking heels 34A push harder against each foot 24A of each leg 24. In this manner, locking retainer 30 can increase the clamping force of top retainer 20. Each locking heel 34A can be angled downwardly as measured from a first end 34A1 where the corresponding leg 24 will initially engage locking heel 34A to a second end 34A2 opposite the first end 34A1. For example, locking heel 34A can be angled at an angle $\alpha$ from first end 34A1 to the second end 34A2. In this manner, top retainer 20, after being placed around board 12 and its legs 24 being placed through apertures 16 of heat sink 14, can be pulled against board 12 and heat sink 14 so that board 12 is held more tightly against heat sink 14 by locking heels 34A as locking retainer 30 is rotated in direction C. This is due to foot 24A (shown in dashed lines in FIG. 5E) of the corresponding leg 24 of top retainer 20 being pulled downwardly along an angled edge 34A3 between first end 34A1 and second end 34A2 of locking heels 34A as locking retainer 30 is rotated in direction C. The angle $\alpha$ can be any angle that allows the tightening of the hold of top retainer 20 while not damaging top retainer 20.

As described above and shown in FIGS. 5A-5E, each of locking receivers 32 can also comprise stop flange 34B that can stop a corresponding leg 24 of top retainer 20 upon rotation of locking retainer 30 in a direction C to prevent over-rotation. Each stop flange 34B can comprise an abutment 35 that foot 24A and/or leg 24 can abut or rest against after locking retainer 30 has been rotated to the point where leg 24 of top retainer 20 is fully engaged as shown in FIG. 5E. Abutment 35 can extend radially outward from an end 34B1 of stop flange 34B distal from body 30A of locking retainer 30. In such embodiments, abutment 35 can extend below second end 34A2 of locking heel 34A so as to be in alignment with foot 24A of leg 24 when locking retainer 30 has been rotated to fully engage top retainer 20 as partially shown in FIG. 5E.

Figure 5A:
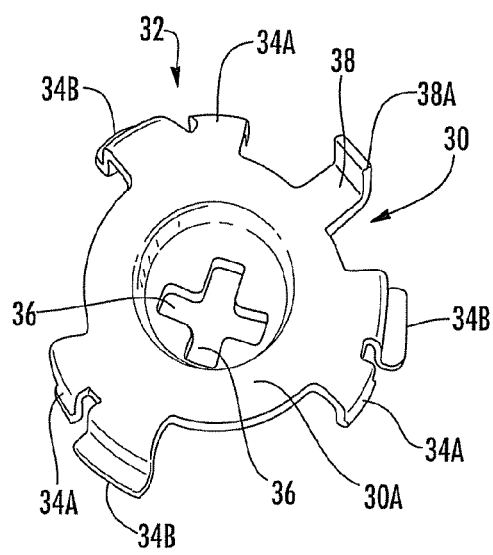
FIGS. 5A and 5B illustrate perspective views of an embodiment of a locking retainer for use in a printed circuit board assembly according to the present subject matter.
Figure 5B:
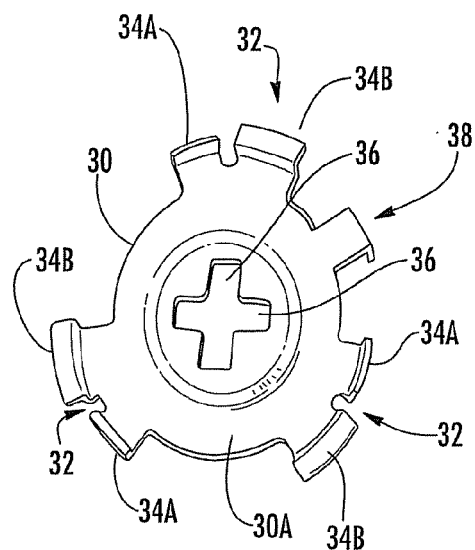
Figure 5C:
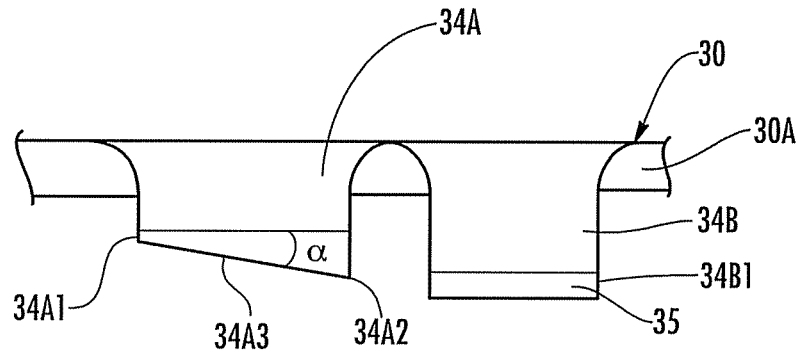
FIGS. 5C, 5D, and 5E illustrate side views of a portion of the embodiment of the locking retainer according to FIGS. 5A and 5B interacting with a portion of a leg of an embodiment of a retainer according to the present subject matter.
Figure 5D:
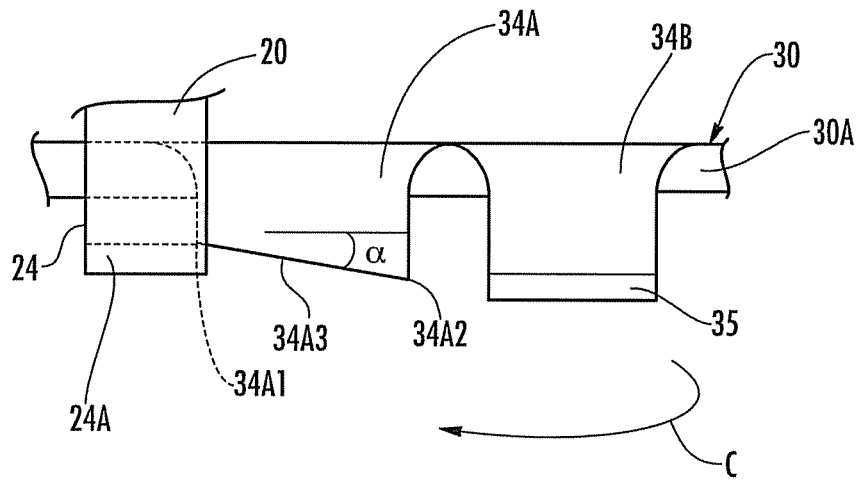
Figure 5E:
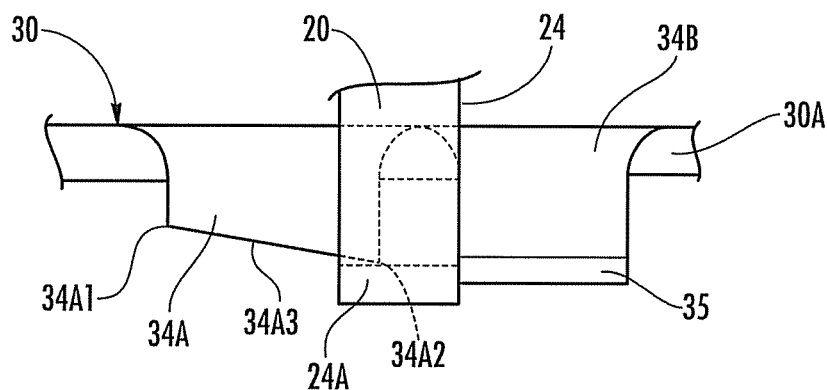

Locking retainer 30 can also comprise slots 36 for accepting a tool, like a screw driver, for rotating locking retainer 30 in a rotational direction A as shown in FIG. 2 (or direction C as shown in FIG. 5D) from a non-engagement position to an engagement position. Locking retainer 30 can rotate in a reverse direction to unlock locking retainer 30 from an engagement position to a non-engagement position. Locking retainer 30 can also comprise an anti-back out feature, such as a locking flange 38 that assists in holding locking retainer 30 in place. In the embodiment shown in FIGS. 5A and 5B, locking flange 38, can comprise an angled projection 38A that engages a slot (not shown) in heat sink 14 to hold locking retainer 30 in place. It is contemplated that locking flange 38 can have other configurations as compared to the one shown in FIGS. 5A and 5B.

Thus, in the manner described above, board 12 can be placed within top retainer 20. Top retainer 20 can then be placed on heat sink 14 with the one or more legs 24 extending through heat sink 14 and locking retainer 30 being securable to one or more leg 24 of top retainer 20. In this manner, due the length of each leg 24 that is determined based on the thickness of printed circuit board 12 and heat sink 14, rear surface 12B of board 12 can be firmly and tightly held in contact with top surface 18 of heat sink 14. By providing uniformity in the contact across rear surface 12B of board 12 against top surface 18 of heat sink 14, more uniform and more effective heat dissipation from printed circuit board 12 can occur.

To prevent the stretching of legs 24 on top retainer 20 with the removal and reattachment of top retainer 20 and board 12, legs 24 of top retainer 20 can fit through apertures 16 in heat sink 14 without contacting interior walls 16A of heat sink 14 that form apertures 16. This increases the repeatable use of the same top retainer 20 with heat sink 14 and board 12.

In some embodiments, a locking retainer is not needed as noted previously. In such embodiments, the top retainer can extend into the heat sink and engage the heat sink, either inside the heat sink or outside the heat sink to hold the retainer to the heat sink. For example, the legs of the top retainer can be elastic in nature and can clip or otherwise fasten or be secured into place on the heat sink. For instance a foot can be on each of the legs that can clip or otherwise attach to or into an indention on the heat sink. The top retainer can in such embodiments rotate into a locking position or can be pushed into a locking position.

Figure 6A:
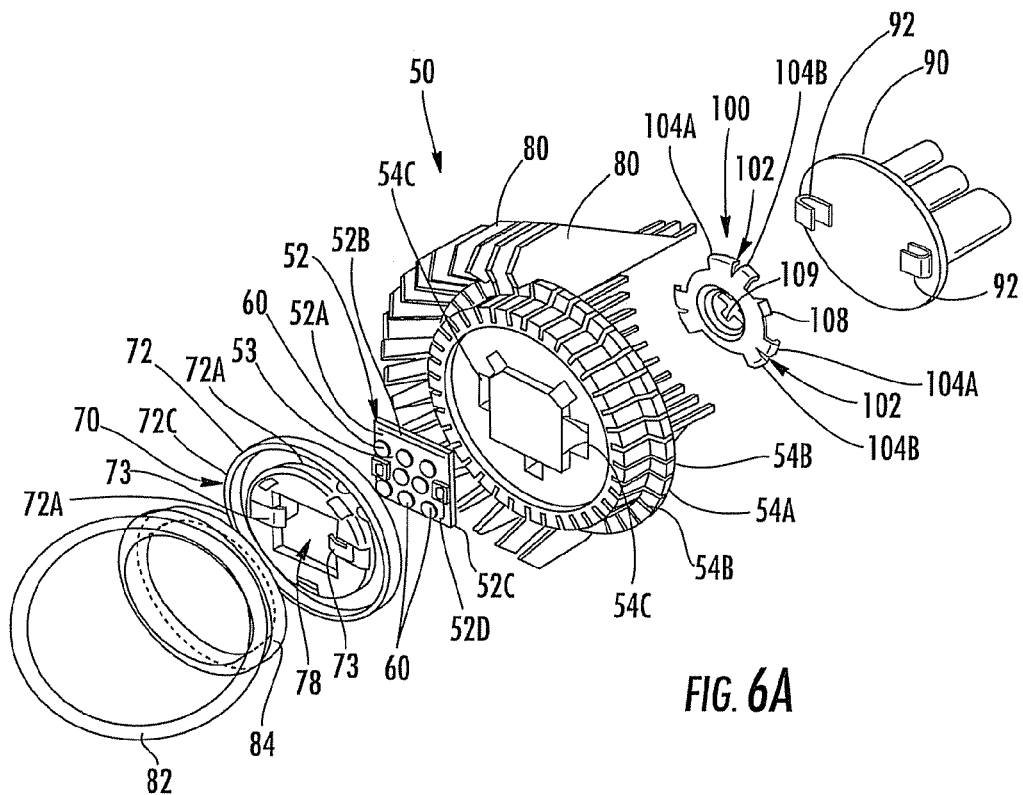
FIG. 6A illustrates an exploded view of an embodiment of a light emitting device assembly according to the present subject matter.
Figure 6B:
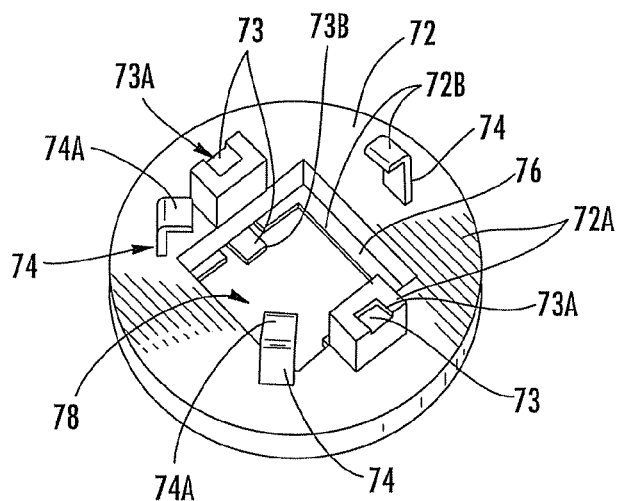
FIG. 6B illustrates a perspective bottom view of an embodiment of a retainer that can be used in the light emitting device assembly according to the present subject matter.

FIGS. 6A and 6B illustrate a light emitting device assembly generally designated 50 that can be used to provide light when secured into certain lighting fixtures. Light emitting device assembly 50 can comprise a board 52 having a face surface 52A and a rear surface 52B opposite face surface 52A. Board 52 can also comprise side edges 52C around a periphery 52D of board 52. Board 52 can further comprise light emitting diode packages 60 thereon. Board 52 can have electrical contacts 53 for electrical connection with a power source for providing electricity to light-emitting diode package 60 as described below in more detail. Light emitting device assembly 50 can also comprise a heat sink 54 for dissipating heat from board 52 and a retainer 70 configured to secure board 52 to heat sink 54.

Retainer 70 can have a body 72 that can be configured to fit around periphery 52D of board 52. Body 72 can form an opening 78 therein for receiving board 52. Contacts 73 can extend into opening 78 to provide electrical connection with electrical contact 53 of board 52. One or more legs 74 can extend downward from body 72 of retainer 70. Retainer 70 can also comprise a lip 76 that can extend over at least a portion of side edges 52C of board 52 when board 52 is inserted into retainer 70. As above, board 52 can comprise a printed circuit board.

Light emitting device assembly 50 also comprise a heat sink 54 to which retainer 70 can help hold board 52 to facilitate dissipation of heat. Heat sink 54 can have a top surface 18 on which the printed circuit board 52 can be mounted. Heat sink 54 can also have an aperture 56 therein through which leg 74 of retainer 70 can extend. Heat sink 54 can be configured to allow for external fins 80 to be attached around a periphery 54A of heat sink 54 to increase the thermal transfer from board 52. Periphery 54A can comprise slots 54B into which fins 80 can be inserted. Fins 80 can be spaced apart to increase the thermal transfer.

As above, board 52 can be placed within retainer 70 so that body 72 fits around at least a portion of periphery 52D of board 52. Additionally, lips 76 can reside over at least a portion of side edges 52C to securely hold board 52. Retainer 70 can then be placed on heat sink 54 with leg 74 extending through aperture 56 of heat sink 54 to secure board 52 to heat sink 54.

Light-emitting device assembly 50 can also comprise a globe 82 that can be in the form of a diffuser dome that aids in dispersing the light emitted by the light-emitting diode package. Additionally, light-emitting device assembly 50 can comprise a driver 90 for driving printed circuit board 52. Body 72 of retainer 70 can comprise a plastic molded portion 72A around a primary retainer structure 72B that can comprise legs 74. For example, primary retainer structure 72B can comprise a metal such as aluminum, aluminum alloy, steel, or the like. Plastic molded portion 72A can be molded around primary retainer structure 72B and contacts 73. In such a manner, primary retainer structure 72B can be electrically insulated from contacts 73.

Plastic molded portion 72A of body 72 can also comprise a retention ring 72C for holding globe 82 to retainer 70 and light-emitting device assembly 50. For example, globe 82 can have a lip 84. Retention ring 72C of body 72 can hold lip 84 to hold globe 82 in place. For instance, lip 84 can fit under a portion of retention ring 72C to hold globe 82 to retainer 70. In this manner, retainer 70 can serve as a retention apparatus for both board 52 and globe 82.

Driver 90 can comprise driver contacts 92 for providing power to board 52 and light-emitting diode package 60. Each of the contacts 73 can be configured to have a driver contact surface 73A and a board contact surface 73B. Heat sink 54 can also define contact apertures 54C through which driver contact surface 73A can extend when retainer 70 is placed in position over board 52 and through heat sink 54. When retainer 70 is placed over board 52 and locked into place, driver contact surfaces 73A of contacts 73 can provide an electrical connection with driver contacts 92 of driver 90 and board contact surfaces 73B of contacts 73 can provide an electrical connection with electrical contacts 53 of board 52. In this manner, power can be provided to board 52 and light-emitting diode package 60 in such an embodiment as illustrated in FIGS. 6A and 6B.

As above, board 52 can comprise any shape. For example, board 52 can have a cross-sectional shape of a circle, square, rectangle or oval. The shape of board 52 is designed to meet the needs of the light emitting device assembly. In the embodiment shown in FIG. 6A for example, the cross-sectional shape of board 52 is in the form of a square.

Retainer 70 can comprise a plurality of lips 76 that can be spaced equidistance apart from each other with each lip 76 being extendable over board 52 when top retainer 70 fastens board 52 to heat sink 54.

In some embodiments, a locking retainer is not needed. In such embodiments, the top retainer can extend into the heat sink and engage the heat sink, either inside the heat sink or outside the heat sink to hold the retainer to the heat sink. For example, the legs of the top retainer can be elastic in nature and can clip or otherwise be attached and secured into place on the heat sink. For instance a foot can be on each of the legs that can attach to or into an indention on the heat sink, such as for example by clipping. The top retainer can in such embodiments rotate into a locking position or can be pushed into a locking position.

Alternatively, in other embodiments as shown in FIG. 6A, legs 74 of top retainer 70 can fit through apertures 56 in heat sink 54 without contacting interior walls of heat sink 54 that form the apertures. In such an embodiment, a locking retainer 100 can be used to secure top retainer 70 to heat sink 54. Locking retainer 100 can comprise one or more receivers 102 for receiving, respectively, one or more legs 74 of retainer 70. Legs 74 of top retainer 70 can comprise a foot 74A that can be engaged by locking retainer 100. For example, the one or more receivers 102 of locking retainer 100 can comprise leg engagement mechanisms in the form of flanges 104A and 104B for securing locking retainer 100 to legs 74 of top retainer 70.

Each of the one or more receivers 102 can comprise a locking heel 104A for engaging a corresponding leg 74 to tightly hold top retainer 70 to heat sink 54 to further press board 52 against heat sink 54. Each of the one or more receivers 102 can also comprise a stop flange 104B that can stop a corresponding leg 74 of top retainer 70 upon rotation of locking retainer 100 in a direction C to prevent over-rotation. Generally, stop flange 104B can be in a position where locking heel 104A holds corresponding leg 74 at its tightest point. Locking heels 104A and stop flanges 104B can be configured in a manner similar to the locking heels and stop flanges described above with respect to FIGS. 5A-5E. However, other configurations are also contemplated.

Locking retainer 100 can also comprise a slot 106 for accepting a tool, such as a screw driver, for rotating locking retainer 100 from a non-engagement position to an engagement position. Slots 106 of locking retainer 100 can also be used to rotate locking retainer 100 from an engagement position to a non-engagement position. Locking retainer 100 can further comprise an anti-back out feature such as a locking flange 108.

Light-emitting diode package 60 that can be placed on board 52 can have a top surface and a bottom surface (not shown). The diodes can be positioned on the top surface of light-emitting diode package 60 and the electrical contacts for electrical connection to board 52 can be on the bottom surface of light-emitting diode package 60. Electrical contacts 53 on board 52 can provide power to light-emitting diode package 60. A plurality of light-emitting diode packages can be provided for placement on board 52 and electrical connection to the electrical contacts on board 52.

Figure 7:
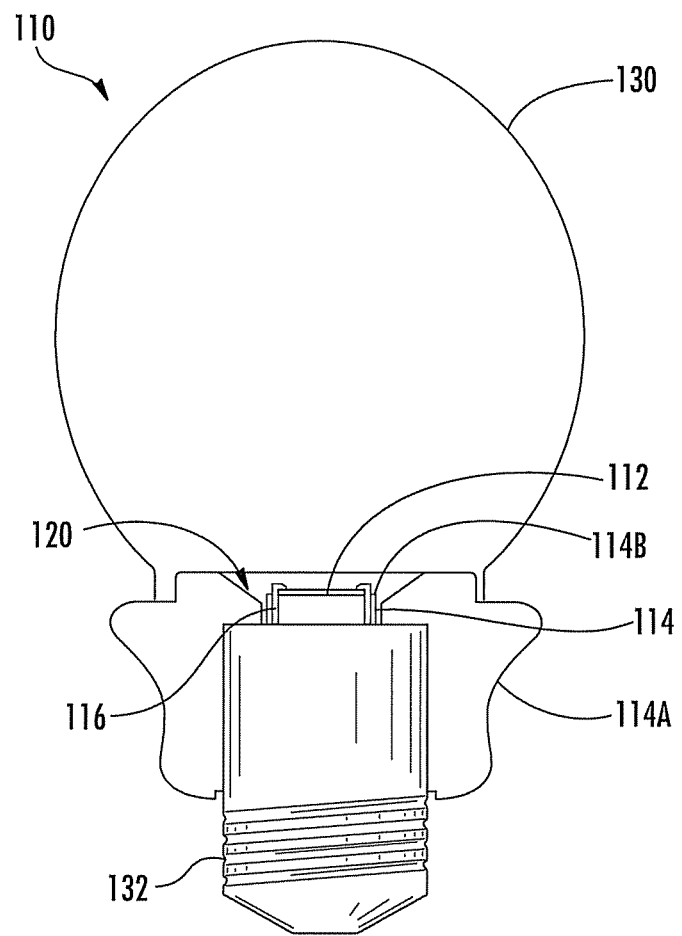
FIG. 7 illustrates a sectional view along the length of another embodiment of a light emitting device assembly according to the present subject matter.

Different light-emitting device assembly embodiments can have many different shapes and sizes. FIG. 7 shows another embodiment of a light-emitting device assembly 110 similar to light-emitting device assembly 50 described above. Light-emitting device assembly 110 can comprise a light source 112 that can comprise a light-emitting diode package and a printed circuit board and a heat sink structure 114 that can comprise fins 114A that are integral to heat sink 114 or can be removably attachable thereto. Light-emitting device assembly 110 can also comprise a retainer 116 as described above that can be used to attach and hold light source 112, and in particular the printed circuit board, to heat sink structure 114. Retainer 116 can be attached in different manners. For example, retainer 116 can lockingly engage heat sink structure 114 or legs on retainer 116 can extend through heat sink structure 114 with a locking retainer (not shown) engaging retainer 116 to hold or secure retainer 116 and light source 112 to heat sink structure 114.

Light-emitting device assembly 110 can also comprise an optical cavity 120 in heat sink structure 114 with light source 112 mounted to top surface of a platform 114B of heat sink structure 114 in optical cavity 120. Light-emitting device assembly 110 can also comprise a diffuser dome 130 mounted to heat sink structure 114, over the optical cavity 120. For example, diffuser dome 130 can be mounted around a portion of fins 114A of heat sink structure 114.

Diffuser dome 130 can be made of the suitable materials, but in this embodiment, diffuser dome 130 can be oval or egg-shaped to provide a different light emission pattern. Diffuser dome 130 can be mounted over cavity 120 and can comprise diffusing or scattering particles. The scattering particles can be provided in a curable binder that is formed in the general shape of dome. Additionally, or alternatively, scattering structures may also be provided as part of the diffuser dome. In some embodiments, scattering structures can be provided in lieu of the scattering particles. Different binder materials can be used such as silicones, epoxies, glass, inorganic glass, dielectrics, BCB, polymides, polymers and hybrids thereof. In some embodiments, white scattering particles can be used with the dome having a white color. This gives dome 130 a white appearance that is generally more visually acceptable or appealing to consumers than the color of the phosphor. For example, diffuser dome 130 can comprise white titanium dioxide particles that can give diffuser dome 130 its overall white appearance.

Diffuser dome 130 can provide the added advantage of distributing the light emitting from the optical cavity in a more omnidirectional and/or uniform pattern. Light from the light source in the optical cavity can be emitted in a generally forward or Lambertian pattern and the shape of diffuser dome 130 along with the scattering properties of the scattering particles/structures causes light to emit from diffuser dome 130 in a more omnidirectional emission pattern. An engineered dome can have scattering particles/structures in different concentrations in different regions or can be shaped to a specific emission pattern. In some embodiments, the dome can be engineered so that the emission pattern from the lamp complies with the Department of Energy (DOE) Energy Star defined omnidirectional distribution criteria. In some embodiments, the light-emitting device assemblies can comprise an A-type retrofit LED bulb that meets the DOE Energy Star. One requirement of this standard met by the light-emitting device assembly 110 is that the emission uniformity must be within 20% of mean value from 0 to 135° viewing and; >5% of total flux from the light-emitting device assembly must be emitted in the 135-180° emission zone, with the measurements taken at 0, 45, 90° azimuthal angles. Light-emitting device assembly 110 can be efficient, reliable and cost effective.

Light-emitting device assembly 110 can comprise a mounting mechanism of the type to fit in conventional electrical receptacles. In the embodiment shown, light-emitting device assembly 110 can comprise a screw-threaded portion 132 for mounting to a standard Edison socket. Alternatively, light-emitting device assembly 110 can comprise a standard plug and the electrical receptacle can be a standard outlet, a bayonet mount, a pin base, such as a GU24 base unit, or it can be a clip and the electrical receptacle can be a receptacle which receives and retains the clip (e.g., as used in many fluorescent lights).

FIGS. 8 through 10 show another embodiment of a light-emitting device assembly 140 according to the present subject matter that can be similar to light-emitting device assembly 110 shown in FIG. 7. Light-emitting device assembly 140 can comprise a light source 142 that can comprise a light-emitting diode package and a printed circuit board and a heat sink structure 144 that can comprise fins 144A that can be integral to heat sink 144 or can be removably attachable thereto. Light-emitting device assembly 140 can also comprise a retainer 146 as described above that can be used to attach and hold light source 142, and in particular the printed circuit board, to heat sink structure 144. As described above, retainer 146 can engage heat sink structure 144 to hold light source 142 to heat sink 144. Alternatively, portions of retainer 146 can extend through heat sink 144 and a locking retainer (not shown) can engage retainer 146 to hold retainer 146 and light source 142 to heat sink structure 144.

Light-emitting device assembly 140 can also comprise an optical cavity 150 in heat sink structure 144. Light source 142 can be mounted to the top surface of a platform 144B of heat sink structure 144 in optical cavity 150. Light-emitting device assembly 140 can further comprise a diffuser dome 160 and a screw-threaded portion 162. Diffuser dome 160, in this embodiment, is flattened on top to provide the desired emission pattern.

Light-emitting device assembly 140 can comprise an interface layer 148 between light source 142 and heat sink structure 144. In some embodiments, interface layer 148 can be electrically insulating to electrically isolate heat sink structure 144 from light source 142. Electrical connection can then be made to the top surface of the light source.

Embodiments of the present disclosure shown in the drawings and described above are exemplary of numerous embodiments that can be made within the scope of the appended claims. It is contemplated that the configurations of light-emitting device assemblies and methods of making the same can comprise numerous configurations other than those specifically disclosed.

What is claimed is:

1. A board assembly comprising:
a board;
a heat sink for dissipating heat from the board, the heat sink comprising a first surface and at least one aperture, the at least one aperture extending between the first surface and a second, opposing surface of the heat sink; and
a non-screw retainer configured to apply a clamping force between the first surface of the heat sink and a contact surface of the board for securing the contact surface of the board to the first surface of the heat sink, wherein the retainer comprises at least one leg adapted to extend through the at least one aperture.

2. The assembly according to claim 1, wherein the retainer comprises a plastic, a metal, a metal alloy, or combinations thereof.

3. The assembly according to claim 1, wherein the board comprises a cross-sectional shape of at least one of a circle, a rectangle or an oval.

4. The assembly according to claim 1, wherein the heat sink has three or more apertures adapted to receive three or more legs of the retainer.

5. The assembly according to claim 1, wherein the at least one leg of the retainer fits through the aperture in the heat sink without contacting interior walls of the heat sink that form the aperture.

6. The assembly according to claim 1, wherein the retainer comprises a body and the body of the retainer comprises a plurality of lips spaced equidistance apart from each other with each lip being extendable over the board when the retainer secures the board to the heat sink.

7. The assembly according to claim 6, wherein the body of the retainer is configured to fit around a portion of the board.

8. The assembly according to claim 1, wherein the second surface of the heat sink comprises a platform and the heat sink further comprises a plurality of fins disposed about the platform.

9. The assembly according to claim 8, wherein the aperture is disposed proximate to the platform.

10. The assembly according to claim 1, further comprising a locking retainer comprising a locking receiver for receiving the at least one leg of the retainer.

11. The assembly according to claim 10, wherein the at least one leg of the retainer comprises a foot that is engageable by the locking retainer.

12. The assembly according to claim 10, wherein the locking receiver of the locking retainer comprises a locking heel that engages the at least one leg upon rotation of the locking retainer and a stop flange for prevention of over-rotation of the locking retainer.

13. A board assembly comprising:
a board comprising a face surface, a rear surface opposite the face surface, and side edges around a periphery of the board;
a non-screw top retainer comprising a body configured to fit around the periphery of the board, the top retainer comprising at least one leg that extends downward from the body;
a heat sink having an aperture therein through which the leg of the top retainer is extendable, wherein the top retainer is configured to apply a clamping force between a first surface of the heat sink and the rear surface of the board for securing the rear surface of the board to the first surface of the heat sink;
a non-screw locking retainer comprising a receiver for receiving a portion of the leg of the top retainer;
wherein a portion of the top retainer is rotatable with respect to a portion of the locking retainer such that portions of top retainer forcibly engage portions of the locking retainer.

14. The assembly according to claim 13, wherein the board comprises a cross-sectional shape of at least one of a circle, rectangle or oval.

15. The assembly according to claim 13, wherein the board comprises a printed circuit board.

16. The assembly according to claim 13, wherein the top retainer comprises a plurality of lips spaced equidistance apart from each other with each lip being extendable over the board when top retainer fastens the board to the heat sink.

17. The assembly according to claim 13, wherein the at least one leg of the top retainer fits through the aperture in the heat sink without bending of the leg against interior walls of the heat sink that form the aperture.

18. The assembly according to claim 13, wherein the leg of the top retainer comprises a foot that is engageable by the locking retainer.

19. The assembly according to claim 13, wherein the locking receiver of the locking retainer comprises a locking heel that engages the leg of the top retainer upon rotation of the locking retainer and a stop flange for prevention of over-rotation of the locking retainer.

20. The assembly according to claim 19, wherein the locking retainer comprises slots for accepting a tool for rotating the locking retainer from a non-engagement position to an engagement position and vice versa.

21. The assembly according to claim 20, wherein the locking retainer comprises an anti-back out feature adapted to secure the locking retainer in the engagement position.

22. A light emitting device assembly comprising:
a board comprising a face surface, a rear surface opposite the face surface and side edges around a periphery of the board, the board comprising electrical contacts for electrical connection and at least one light emitting device package disposed on the board;
a heat sink having one or more fins for dissipating heat from the board and a contact surface provided adjacent the rear surface of the board; and
a retainer configured to secure the rear surface of the board to the contact surface of the heat sink, the retainer comprising a retainer body disposed at least partially about the periphery of the board, wherein a portion of the retainer extends from at or above the face surface of the board to below the contact surface of the heat sink.

23. The assembly according to claim 22, wherein the board comprises a cross-sectional shape of at least one of a circle, rectangle or oval.

24. The assembly according to claim 22, wherein the board comprises a printed circuit board.

25. The assembly according to claim 22, wherein the retainer comprises a plastic, a metal, a metal alloy, or combinations thereof.

26. The assembly according to claim 22, comprising a globe that covers the light-emitting diode package, and is secured to the retainer.

27. The assembly according to claim 22, comprising a plurality of light-emitting diode packages on the board and electrical connection to the board.

28. The assembly according to claim 27, comprising a globe that covers the plurality of light-emitting diode packages, and is secured to the retainer.

29. The assembly according to claim 22, wherein the retainer is configured to receive at least a portion of the board and the retainer comprises at least one leg with the heat sink being configured to receive at least a portion of the leg of the retainer to secure the board to the heat sink.

30. The assembly according to claim 29, wherein the heat sink has an aperture therein through which the at least one leg is extendable.

31. The assembly according to claim 29, wherein the at least one leg of the retainer fits through the aperture in the heat sink without bending of the leg against interior walls of the heat sink that form the aperture.

32. The assembly according to claim 29, wherein the retainer comprises a body and the body of the retainer comprises a plurality of lips spaced equidistance apart from each other with each lip being extendable over the board when the retainer fastens the board to the heat sink.

33. The assembly according to claim 32, wherein the body of the retainer is configured to fit around the periphery of the board.

34. The assembly according to claim 29, further comprising a locking retainer comprising a locking receiver for receiving the leg of the retainer.

35. The assembly according to claim 34, wherein the leg of the retainer comprises a foot that is engageable by the locking retainer.

36. The assembly according to claim 34, wherein the locking receiver of the locking retainer comprises leg engagement mechanisms for securing the locking retainer to each leg of the retainer.

37. The assembly according to claim 34, wherein the locking receiver of the locking retainer comprises a locking heel that engages the leg of the retainer upon rotation of the locking retainer and a stop flange for prevention of over-rotation of the locking retainer.

38. The assembly according to claim 34, wherein the locking retainer comprises slots for accepting a tool for rotating the locking retainer from a non-engagement position to an engagement position and vice versa.

39. The assembly according to claim 38, wherein the locking retainer comprises an anti-back out feature adapted to secure the locking retainer in the engagement position.

40. A method of making a printed circuit board assembly, the method comprising:
providing a board comprising a face surface and an opposing rear surface;
providing a heat sink for dissipating heat from the board, the heat sink comprising a contact surface;
providing the rear surface of the board over the contact surface of the heat sink;
providing a non-screw first retainer;
applying a clamping force between the contact surface of the heat sink and the rear surface of the board upon insertion of a portion of the first retainer into a portion of the heat sink; and
providing a locking retainer comprising a receiver for receiving a portion of the leg of the first retainer; and
rotating a locking retainer with respect to the first retainer to secure the board to the heat sink.

41. The method according to claim 40, wherein the first retainer comprises at least one leg and the heat sink has an aperture therein.

42. The method according to claim 41, further comprising placing the first retainer around the board and receiving the leg of the retainer into the aperture of the heat sink to secure the board to the heat sink.

43. The method according to claim 42, further comprising providing a light-emitting device package and securing the light-emitting diode package to the board for creating a light-emitting device assembly.

44. The method according to claim 42, further comprising securing the locking retainer to the leg of the top retainer upon placement of the first retainer around the board with the leg of the first retainer extending into the heat sink to secure the board to the heat sink.

45. The method according to claim 44, further comprising rotating the locking retainer to secure the locking retainer to the leg of the first retainer.

* * * * *